United States Patent [19]
Winer et al.

[11] Patent Number: 5,948,217
[45] Date of Patent: *Sep. 7, 1999

[54] METHOD AND APPARATUS FOR ENDPOINTING WHILE MILLING AN INTEGRATED CIRCUIT

[75] Inventors: Paul Winer, Santa Clara; Richard H. Livengood, Los Gatos, both of Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/771,712

[22] Filed: Dec. 20, 1996

[51] Int. Cl.$^6$ .............................. C23C 14/46; C23C 14/34
[52] U.S. Cl. ............................... 204/192.34; 204/192.33; 204/298.32; 204/298.36; 216/94; 438/474
[58] Field of Search .................... 204/194.33, 194.34, 204/298.32, 298.36; 216/94; 250/492.3, 397; 438/474

[56] References Cited

FOREIGN PATENT DOCUMENTS 88305199  8/1988  United Kingdom ............ H01L 21/66

OTHER PUBLICATIONS

Basic Photovoltaic Principles and Methods, Solar Energy Research Institute, pp. 14–17, Dec. 1984.

Paul Winer, "IC Failure Analysis, E–Beam Tutorial," International Reliability and Physics Symposium, 1996.

Ann N. Campbell, Fault Localization with the Focused Ion Beam (FIB) System, in Microelectronic Failure Analysis, ASM International, 1996.

*Primary Examiner*—Nam Nguyen
*Assistant Examiner*—Steven H. Ver Steeg
*Attorney, Agent, or Firm*—Blakely, Sokoloff, Taylor & Zafman

[57] ABSTRACT

A method and an apparatus for endpoint determination when milling an integrated circuit disposed in a substrate. In one embodiment, the substrate is charged to a first polarity while the well regions and active diffusion regions of the integrated circuit are charged to another polarity thus resulting in an electrical bias at the P-N junctions in the substrate. By powering up the integrated circuit in this fashion during milling, endpoint detection can be accurately determined by using a voltage contrast mechanism such as the imaging detector of a focused ion beam (FIB) milling tool. A diffusion boundary can also be determined in accordance with the teachings of the invention by the use of the stage current monitor of the FIB milling tool. The diffusion boundary is determined in accordance with the teachings of the present invention by a change in contrast as detected by the imaging detector of the FIB milling tool or by a change in the stage current as measured by the stage current monitor of the FIB milling tool. By accurately determining when a diffusion boundary is reached, the present invention reduces the risk of inadvertently destroying diffusion regions when exposing features in an integrated circuit during debug.

33 Claims, 4 Drawing Sheets

METHOD AND APPARATUS FOR ENDPOINTING WHILE MILLING AN INTEGRATED CIRCUIT

BACKGROUND OF THE INVENTION

1. Field of the Invention

The present invention relates generally to the field of integrated circuit testing and, more specifically, the present invention relates to endpoint determination when milling an integrated circuit.

2. Description of the Related Art

Once a newly designed integrated circuit has been formed on a silicon substrate, the integrated circuit must be thoroughly tested to ensure that the circuit performs as intended. Any portion of the integrated circuit that does not function properly must be identified so that it can be fixed by modifying the design of the integrated circuit. This process of testing an integrated circuit to identify problems with its design is known as debugging. After debugging the integrated circuit and correcting any problems with its design, the final fully functional integrated circuit designs are used to mass produce the integrated circuits in a manufacturing environment for consumer use.

During the debugging process, it is sometimes necessary to probe certain internal electrical nodes in the integrated circuit in order to obtain important electrical data from the integrated circuit, such as for example voltage levels, timing information, current levels and thermal information. One method of probing integrated circuit nodes to obtain the important electrical data involves milling the substrate of the integrated circuit to expose an active diffusion region of interest. Once exposed, the active diffusion region of interest may be probed directly to obtain electrical data using a variety of techniques.

FIG. 1 is an illustration of a cross-section of active diffusion region 103 disposed in an integrated circuit substrate 101. As shown in FIG. 1, active diffusion region 103 is bordered by isolation oxide regions 105 and 107. Active diffusion region 103 is coupled to ground 113 through metal interconnect 111. Similarly, substrate 101 is coupled to ground 115.

Assuming it is desired to collect electrical data from active diffusion region 103, one method of probing active diffusion region 103 involves exposing active diffusion region 103 by milling substrate 101 to create opening 109. Once opening 109 is created in substrate 101, active diffusion region 103 is exposed and may then be probed using a variety of techniques.

An important issue that must be considered when milling an integrated circuit substrate 101 is endpointing, which is determining precisely when to discontinue the milling procedure. For instance, if on the one hand milling is discontinued prematurely, then opening 109 would be too shallow and therefore not adequately expose active diffusion region 103. If on the other hand the milling process is not stopped in time, then opening 109 may be too deep and result in active diffusion region 103 being unintentionally damaged or destroyed.

Present day techniques for endpointing, or determining when to stop milling, involve utilizing a focused ion beam (FIB) milling tool, which focuses an ion beam on the surface of substrate 101 during the milling procedure. Since isolation oxide regions 105 and 107 are dielectric regions and since there is no path to ground from these regions, the focused ion beam of the FIB milling tool charges isolation oxide regions 105 and 107 once they are reached and become exposed. In contrast, active diffusion region 103 conducts charge and therefore provides a path to ground 113 through metal interconnect 111. The same holds true for substrate 101 in that there is a path to ground 115 for any charge received from the ion beam. Therefore, active diffusion region 103 and substrate 101 do not become charged from the focused ion beam of the FIB milling tool when exposed.

Accordingly, an imaging detector included in the FIB milling tool can image the substrate during milling and detect when isolation oxide regions 105 and 107 become charged and are therefore reached. For instance, if the FIB milling tool is in electron contrast mode, isolation oxide regions 105 and 107 will appear dark when charged relative to other grounded neighboring regions. If, for example, the imaging detector of the FIB system is in ion contrast mode, then oxide regions 105 and 107 will appear light when charged relative to the other grounded neighboring regions.

Since active diffusion region 103 is disposed near isolation oxide regions 105 and 107 as shown in FIG. 1, milling can be stopped when isolation oxide regions 105 and 107 are reached with the FIB tool. When milling is completed, active diffusion region 103 is effectively exposed for probing purposes.

One disadvantage of the present day technique illustrated in FIG. 1 for exposing an active diffusion region in an integrated circuit substrate is that it is extremely important to accurately determine the location to mill in the substrate when exposing an active diffusion region of interest. To illustrate, FIG. 2 is an illustration of a cross-section of an active diffusion region 203 in an integrated circuit substrate 201. Active diffusion region 203 is bordered by isolation oxide regions 205 and 207. The integrated circuit cross-section illustrated in FIG. 2 also includes a transistor, which includes active diffusion regions 219 and 221 disposed in well region 217 with a gate electrode 223. Also illustrated in FIG. 2 is another transistor that includes active diffusion regions 229 and 231 disposed in well region 227 with gate electrode 233. Active diffusion region 203 is coupled to ground 213 through metal interconnect 211. Integrated circuit substrate 201 is coupled to ground 215. Well regions 217 and 227 are coupled to ground at locations 225 and 235 respectively.

Assuming it is desired to collect electrical data from active diffusion region 203, integrated circuit substrate 201 is milled to expose active diffusion region 203 for probing. Assuming further that there is a slight inaccuracy in the milling location selected to expose active diffusion region 203, there is a risk of destroying neighboring features in the integrated circuit substrate 201. For instance, as shown in FIG. 2, it is desired to expose active diffusion region 203 and opening 209 is therefore milled. As also shown in FIG. 2, opening 209 is slightly offset and well region 217 is therefore unintentionally milled as well.

By using present day techniques for endpointing, the milling process is not stopped until isolation oxide region 205 is reached as indicated by the imaging detector of the FIB milling tool. As shown in FIG. 2, well region 217 is deeper than isolation oxide region 205. Consequently, a significant portion of well region 217 is milled before the milling process is discontinued as indicated by isolation oxide region 205 when creating opening 209. In some instances, a severe amount of well region 217 is removed before milling is discontinued and the associated transistor is destroyed as a result. Thus, isolation oxide regions 205 and 207 sometimes do not adequately indicate when the milling procedure should be stopped.

It is appreciated that it may be possible to detect changes in diffusion doping chemistry to determine when to discontinue the FIB milling process by means of a mass spectrometer analysis of the chamber exhaust. However, the low secondary ion yield during FIB milling process results in a poor signal to noise ratio and therefore does not provide an accurate endpoint determination. Furthermore, it a noted that this type of technique is also very costly.

Therefore, what is needed is a method and an apparatus for endpoint determination when milling an integrated circuit substrate. Such a method would provide a technique for accurately determining when to stop the milling process when a diffusion boundary is reached. Such a method and an apparatus would reduce the risk of inadvertently destroying neighboring features of an integrated circuit diffusion being exposed during the milling process. Such a method and apparatus should be easily adaptable to existing milling tools, require little if any modifications to the existing equipment and be extremely low cost.

SUMMARY OF THE INVENTION

A method and an apparatus for milling an integrated circuit disposed in a substrate is described. In one embodiment, the substrate of an integrated circuit is charged to a first polarity while a well disposed in the substrate is charged to a second polarity. The substrate is then milled with a particle beam milling tool and it is detected when the well is exposed. Additional features and benefits of the present invention will become apparent from the detailed description, figures and claims set forth below.

DESCRIPTION OF THE DRAWINGS

The present invention is illustrated by way of example and not limitation in the accompanying figures.

DETAILED DESCRIPTION

A method and an apparatus for milling an integrated circuit disposed in a substrate is disclosed. In the following description numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

The present invention provides a method of an apparatus for milling an integrated circuit disposed in the substrate in which it can be easily determined when a P-N junction has been reached during milling. Endpoint determination is provided in accordance with the teachings of the present invention by biasing P-N junctions in the integrated circuit with a suitable voltage source. When biased in this manner, a voltage contrast mechanism such as an imaging detector in a particle beam milling tool can then provide a clear indication of the P-N junction. This voltage contrast mechanism can be observed either in the electron contrast mode of imaging or in the ion contrast mode of imaging in the particle beam milling tool. In addition, a change in the specimen current between the particle beam and the specimen holder would also be detected when a P-N junction is reached during milling.

Figure 1:
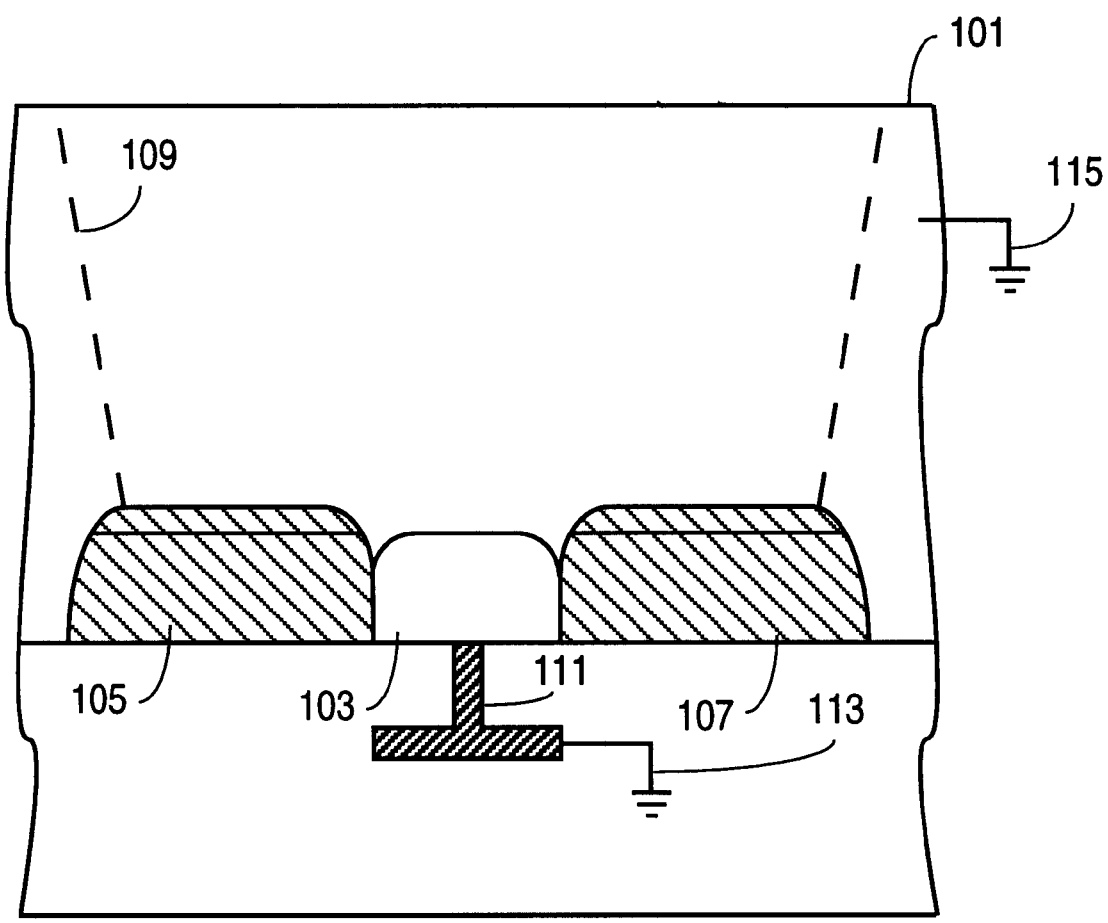
FIG. 1 is an illustration of a cross-section of an active diffusion region disposed in a substrate being exposed for probing purposes.
Figure 2:
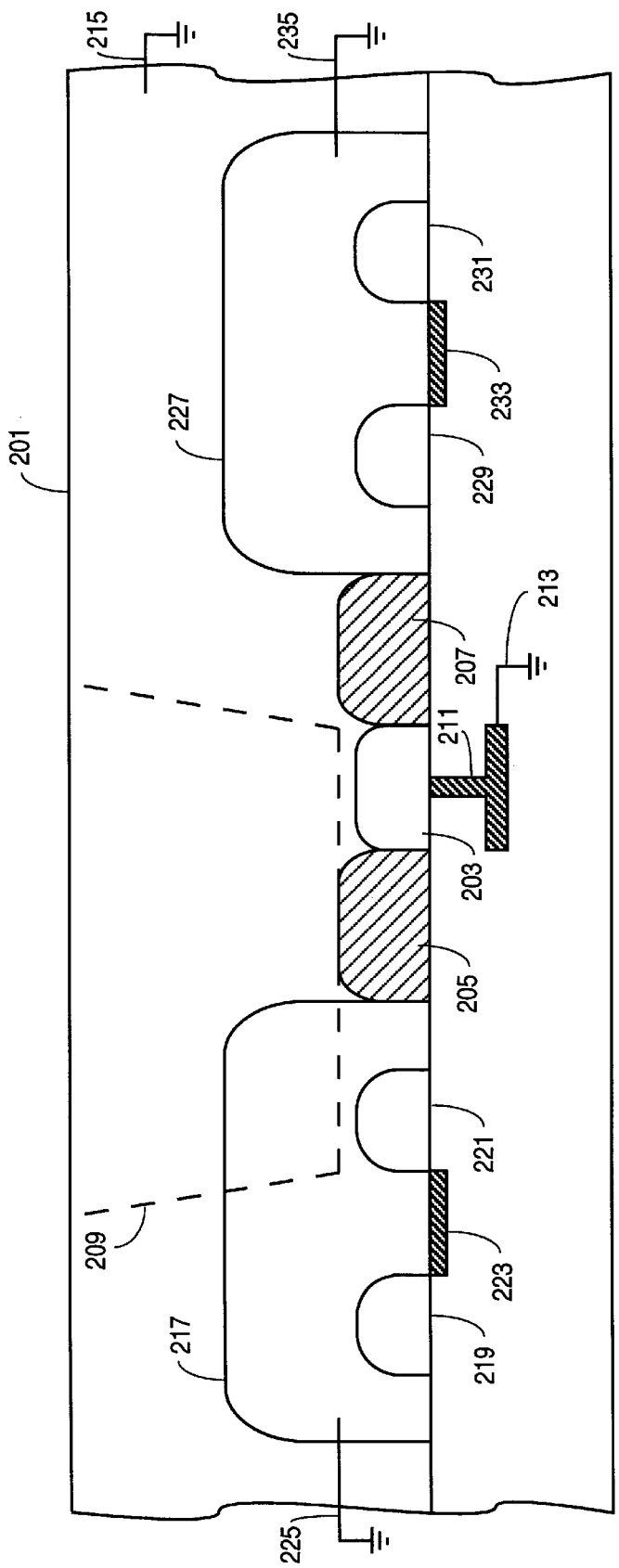
FIG. 2 is an illustration of a cross-section of a transistor well that is inadvertently milled as a result of an active diffusion region desired to be probed being exposed.
Figure 3:
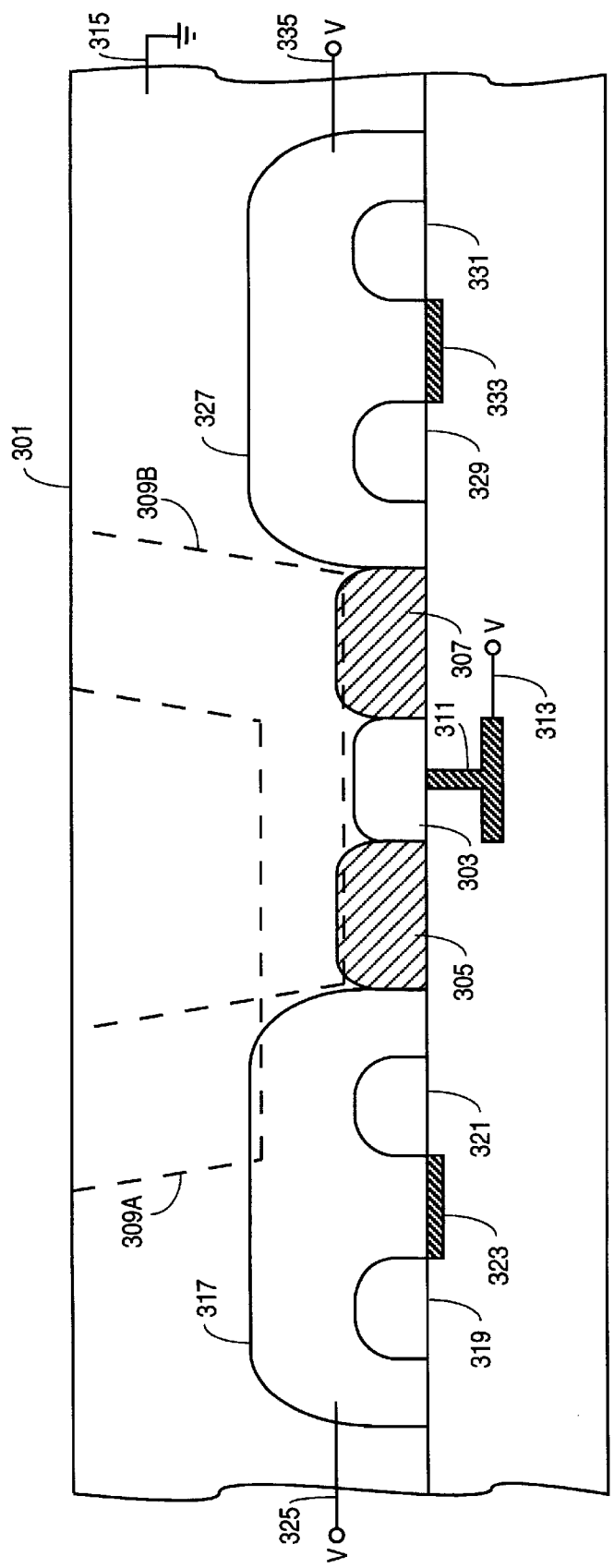
FIG. 3 is an illustration of a cross-section of an integrated circuit being milled in accordance with the teachings of the present invention to expose a feature of interest.

FIG. 3 is an illustration of a cross-section of an integrated circuit substrate 301 having active diffusion region 303, from which it is desired to collect electrical data. Accordingly, it is desired to mill integrated circuit substrate 301 to expose active diffusion region 303 for probing. As shown in FIG. 3, active diffusion region 303 is bordered by isolation oxide regions 305 and 307. In addition, FIG. 3 also shows a transistor disposed in well region 317 which includes active diffusion regions 319 and 321 and gate electrode 323. Well region 327 includes active diffusion regions 329 and 331 and gate electrode 333.

In accordance with the teachings of the present invention, well region 317 is coupled to V 325, well region 327 is coupled to V 335 and active diffusion region 303 is coupled to V 313 through metal interconnect 311 while integrated circuit substrate 301 is coupled to ground 315 during milling. In the example shown in FIG. 3, integrated circuit substrate 301 is P-doped silicon while well regions 317, 327 and active diffusion region 303 are N-doped silicon. Assuming V 313, 325 and 335 are three volts, there is a three volt bias across the P-N junctions shown in FIG. 3 during milling. In another embodiment of the present invention, V 313, 325 and 335 are independently biased and, therefore, the presently described P-N junctions are not necessarily limited to being biased to the same voltage.

Assuming an example of milling integrated circuit substrate 301 to expose active diffusion region 303 for probing purposes, the P-doped silicon of integrated circuit substrate 301 will appear bright on the imaging display of a particle beam milling tool since the grounded P-doped silicon provides a significant source of electrons from ground 315. Assuming further that opening 309A is the milled path of the milling procedure, well region 317 will appear dark in the imaging display when it is exposed since it is coupled to V 325, which is a positive three volt source in this example. Since well region 317 is positively charged, the electric field of the exposed silicon of well region 317 significantly reduces the number of electrons reaching the imaging detector and therefore appears dark. As a result, milling can be discontinued immediately once well region 317 is inadvertently exposed so as to minimize the damage to well region 317, therefore not destroying the associated transistor. Afterwards, the milling can be adjusted and accurately realigned as shown in FIG. 3 with milled region 309B. Endpoint determination can be made in accordance with the teachings of the present invention as soon as either isolation oxide regions 305 and 307 are reached or active diffusion region 303 is reached since there will be a change in contrast as soon as any of these regions are exposed with the particle beam milling tool.

In one embodiment of the present invention, the particle beam milling tool used to mill integrated circuit substrate 301 is a focused ion beam (FIB) milling tool. In another embodiment, an electron beam milling tool may be used as the particle beam milling tool. In yet another embodiment of the present invention, a photon beam milling tool may be used as the particle beam milling tool.

It is appreciated that the teachings of the present invention may also apply to P-doped well and active diffusion regions disposed in N-doped silicon substrates so long as there is a change in polarity between the P-N junctions. With the presently described configuration, there will be a change in contrast when a P-N junction is reached during milling with the particle beam milling tool.

In one embodiment of the present invention, the imaging detector used in the particle beam milling system is an electron imaging detector. In another embodiment of the present invention, the imaging detector is an ion imaging detector used in the particle beam milling system. Each detector indicates when a P-N junction is crossed during milling by a change in contrast with the difference between the two imaging systems being that each imaging system produces images that are negatives of each other.

In another embodiment of the present invention, a stage current monitor of the FIB system can be used to detect when a P-N junction is crossed. The stage current monitor in the FIB system measures the current flowing through the mounted specimen or sample during milling. It is appreciated that with the P-N junctions biased in accordance with the teachings of the present invention, a change in the stage current as indicated by the stage current monitor will occur when a biased junction is reached during milling. When the stage current monitor indicates a change in stage current, it is determined that a P-N junction has been reached in the integrated circuit. Accordingly, milling can be discontinued immediately since an active diffusion region or a well region has been reached in accordance with the teachings of the present invention.

Figure 4:
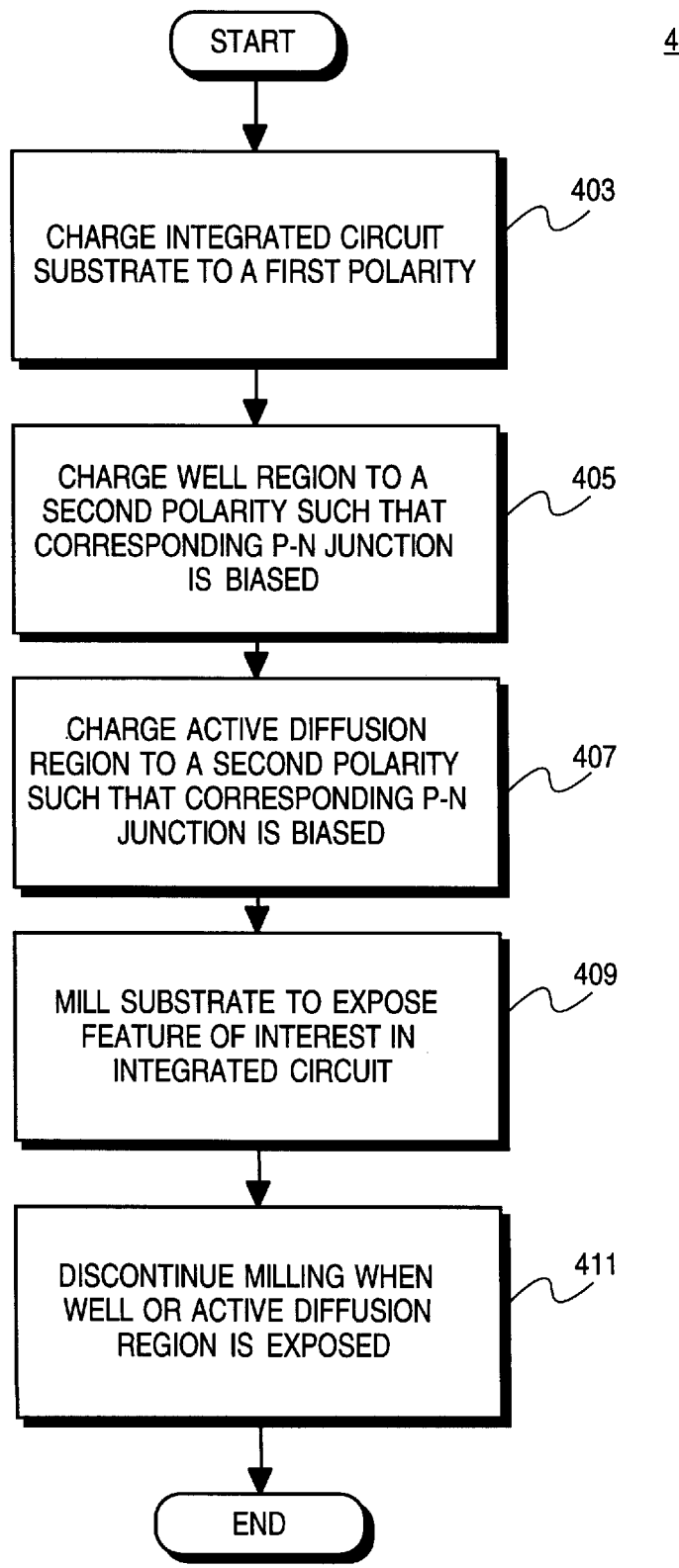
FIG. 4 is a flow diagram of the processing steps performed in accordance with the teachings of the present invention.

FIG. 4 is a flow diagram 401 of the processing steps performed in accordance with the teachings of the present invention. As indicated in processing block 403, the substrate of the integrated circuit is charged to a first polarity, while the well and active diffusion regions of the integrated circuit are charged to a second polarity such that the associated P-N junctions are biased as indicated in processing blocks 405 and 407 respectively. By powering up the integrated circuit in this fashion and then milling, the crossing of electrically biased junctions, and thus the exposure of the corresponding well or active diffusion regions, can be determined by a change in contrast observed by the imaging detector of the particle beam milling tool or by a change in the stage current as observed by the stage current monitor of the particle beam milling tool as indicated in processing blocks 409 and 411 respectively.

It is appreciated that the present invention is easily adaptable to existing FIB milling tools. A voltage source and corresponding fixturing may be utilized to provide electrical connections to the integrated circuit sample to electrically bias the P-N junctions as described in accordance with the teachings of the present invention. These additions require little if any modifications to present day equipment and are extremely low in cost since present day FIB milling tools commonly include imaging detectors as well as stage current monitors.

Therefore, what has been described is a method and an apparatus for milling an integrated circuit disposed in a substrate. With the presently described milling system, it can be easily and accurately determined when a region of silicon having a different polarity than the polarity of the substrate being milled is reached. Accordingly, it can therefore be easily determined when a biased P-N junction has been exposed during milling with the presently described invention.

In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method for milling an integrated circuit disposed in a substrate, the method comprising the steps of:

coupling the substrate to a first voltage source to charge the substrate to a first voltage having a first polarity;

coupling a well region disposed in the substrate to a second voltage source to charge the well region to a second voltage having a second polarity, the first and second polarities being different;

milling the substrate with a particle beam milling tool; and detecting when the well region is exposed.

2. The method described in claim 1 wherein the detecting step includes the step of imaging the milled substrate with an imaging detector to monitor for a change in contrast, the well region being exposed when there is the change in contrast.

3. The method described in claim 2 wherein the imaging detector is an electron imaging detector.

4. The method described in claim 2 wherein the imaging detector is an ion imaging detector.

5. The method described in claim 1 including the additional step of:

charging an active diffusion region disposed in the substrate to the second polarity before the step of milling the substrate; and detecting when the active diffusion region is exposed.

6. The method described in claim 5 wherein the substrate is a P-doped region and the active diffusion region and the well region are N-doped regions.

7. The method described in claim 6 wherein the second polarity is positive with respect to the first polarity.

8. The method described in claim 5 wherein the substrate is an N-doped region and the active diffusion region and the well region are P-doped regions.

9. The method described in claim 8 wherein the first polarity is positive with respect to the second polarity.

10. The method described in claim 1 including the additional step of detecting when an oxide disposed in the substrate is exposed.

11. The method described in claim 1 wherein the detecting step includes the step of monitoring a stage current of the particle beam milling tool, the well region being exposed where there is a change in the stage current of the particle beam milling tool.

12. The method described in claim 1 wherein particle beam milling tool is a focused ion beam (FIB) milling tool.

13. The method described in claim 1 wherein particle beam milling tool is an electron beam milling tool.

14. The method described in claim 1 wherein particle beam milling tool is a photon beam milling tool.

15. An integrated circuit milling apparatus for milling a substrate in which the integrated circuit is disposed, comprising:

a voltage source coupled to the substrate and a well region disposed in the substrate, the voltage source to charge the substrate to a first voltage having a first polarity and the well region to a second voltage having a second polarity, the first and second polarities being different;

a particle beam milling tool configured to mill the substrate; and an imaging detector configured to image the substrate when milled to monitor for a change in contrast, the imaging detector further configured to detect when the well region is exposed by the change in contrast.

16. The integrated circuit milling apparatus described in claim 15 wherein the voltage source is further coupled to an active diffusion region disposed in the substrate, the voltage source charging the active diffusion region to the second polarity such that the imaging detector detects when the active diffusion region is exposed by the change in contrast.

17. The integrated circuit milling apparatus described in claim 16 wherein the second polarity is positive with respect to the first polarity.

18. The integrated circuit milling apparatus described in claim 16 wherein the first polarity is positive with respect to the second polarity.

19. The integrated circuit milling apparatus described in claim 15 wherein the imaging detector detects when an oxide disposed in the substrate is exposed by the change in contrast.

20. The integrated circuit milling apparatus described in claim 15 wherein the imaging detector is an electron imaging detector.

21. The integrated circuit milling apparatus described in claim 15 wherein the imaging detector is an ion imaging detector.

22. The integrated circuit milling apparatus described in claim 15 wherein the particle beam milling tool includes a stage current monitor, the stage current monitor indicating a change in a stage current when the well region is exposed.

23. The integrated circuit milling apparatus described in claim 15 wherein the particle beam milling tool is a focused ion beam (FIB) milling tool.

24. The integrated circuit milling apparatus described in claim 15 wherein the particle beam milling tool is an electron beam milling tool.

25. The integrated circuit milling apparatus described in claim 15 wherein the particle beam milling tool is a photon beam milling tool.

26. An integrated circuit milling apparatus for milling a substrate in which the integrated circuit is disposed, comprising:

voltage generation means coupled to the substrate and a well region disposed in the substrate to charge the substrate to a first voltage having a first polarity and the well region to a second voltage having a second polarity, the first and second polarities being different;

milling means for milling the substrate; and detection means for detecting when the well region is exposed.

27. The integrated circuit milling apparatus described in claim 26 wherein the detection means includes imaging detection means for imaging the substrate when milled to detect a change in contrast, the imaging detection means detecting when the well region is exposed by the change in contrast.

28. The integrated circuit milling apparatus described in claim 27 wherein the voltage generation means is further coupled to an active diffusion region disposed in the substrate, the voltage generation means for charging the active diffusion region to the second polarity such that the imaging detection means detects when the active diffusion region is exposed by the change in contrast.

29. The integrated circuit milling apparatus described in claim 27 wherein the imaging detection means detects when an oxide disposed in the substrate is exposed by the change in contrast.

30. The integrated circuit milling apparatus described in claim 27 wherein the imaging detection means is an electron imaging detector.

31. The integrated circuit milling apparatus described in claim 27 wherein the imaging detection means is an ion imaging detector.

32. The integrated circuit milling apparatus described in claim 27 wherein the second polarity is positive with respect to the first polarity.

33. The integrated circuit milling apparatus described in claim 26 wherein the detection means includes stage current monitoring means for monitoring a stage current in the milling means, the stage current monitoring means detecting when the well region is exposed by detecting a change in the stage current in the milling means.

* * * * *